(12) United States Patent
Chan et al.

(10) Patent No.: US 7,005,626 B2
(45) Date of Patent: Feb. 28, 2006

(54) ULTRA LOW VOLTAGE CMOS IMAGE SENSOR ARCHITECTURE

(75) Inventors: Mansun Chan, North Point (HK); Chen Xu, Kowloon (HK); Wing-Hung Ki, New Territories (HK)

(73) Assignee: The Hong Kong University of Science and Technology, Kowloon (HK)

( * ) Notice: Subject to any disclaimer, the term of this patent is extended or adjusted under 35 U.S.C. 154(b) by 106 days.

(21) Appl. No.: 10/219,260

(22) Filed: Aug. 16, 2002

(65) Prior Publication Data

US 2004/0031905 A1  Feb. 19, 2004

(51) Int. Cl.
H01L 27/14    (2006.01)

(52) U.S. Cl. .................... 250/208.1; 257/292; 348/308

(58) Field of Classification Search ............. 250/208.1, 250/214 R, 214 A; 257/290–292, 431, 443, 257/444; 348/294, 296, 301, 308
See application file for complete search history.

(56) References Cited

U.S. PATENT DOCUMENTS

| 6,130,713 | A * | 10/2000 | Merrill ........................ 348/308 |
| 6,215,113 | B1 * | 4/2001 | Chen et al. ................ 250/208.1 |
| 6,380,572 | B1 * | 4/2002 | Pain et al. .................... 257/292 |
| 6,429,413 | B1 * | 8/2002 | Kawahara et al. ........ 250/208.1 |
| 6,583,440 | B1 * | 6/2003 | Yasukawa ..................... 257/59 |

* cited by examiner

*Primary Examiner*—Kevin Pyo
(74) *Attorney, Agent, or Firm*—Buchanan Ingersoll PC

(57) ABSTRACT

A pixel element for an image sensor comprising, a photodiode and a reset transistor connected to an input node, wherein said reset transistor is a PMOSFET connected between said input node and the supply voltage, and wherein said pixel further comprises parallel complementary signal paths.

19 Claims, 6 Drawing Sheets

(a)

(b)

(b)

(a)

ULTRA LOW VOLTAGE CMOS IMAGE SENSOR ARCHITECTURE

FIELD OF THE INVENTION

This invention relates to a novel architecture for a CMOS-based image sensor, and in particular to an architecture suitable for use at ultra-low voltages (eg below 1V).

BACKGROUND OF THE INVENTION

CMOS-based image sensors have a wide range of potential applications since they may be integrated into a number of electronic products such as personal computers, cellular telephones, personal digital assistants and many others. CMOS active pixel sensors (APS) exploit the mature CMOS industry and can compete with charge coupled devices for low power, high levels of integration and functionality.

In recent years much effort has been made into reducing the required voltage supply to facilitate the incorporation of APS devices in portable applications such as mobile phones, and personal digital assistants which all need to minimize power consumption in order to maximize battery life. However, if the voltage supply goes below 1V, this has an enormous impact on the signal-to-noise ratio and the dynamic range of the pixels, not only because of the lower allowable signal voltages, but also because of the presence of larger noise voltages due to lower currents. In order to maximize the signal-to-noise ratio and dynamic range of the pixel, the signals have to be as large as possible, preferably from rail-to-rail, and so the pixel has to be equipped with a rail-to-rail input as well as a rail-to-rail output stage.

PRIOR ART

FIG. 1(a) shows the structure of a conventional APS design. In this structure the highest available output voltage $V_{out}$ is limited by the $V_T$ drop of the NMOS reset transistor M1 and the source follower M2, and therefore the maximum available output swing is only $V_{DD}-2V_T-V_{Dsat}$ and this significantly limits the dynamic range of the CMOS APS of FIG. 1(a) as is shown in FIG. 1(b). The APS shown in FIG. 1(a) cannot function at a supply voltage of 1V or below, or at least cannot function without very complex output circuits.

SUMMARY OF THE INVENTION

According to a first aspect of the present invention there is provided a pixel element for an image sensor comprising, a photodiode and a reset transistor connected to an input node, wherein said reset transistor is a PMOSFET connected between said input node and the supply voltage. The topology can also be reversed such that the photodiode is connected between the input node and the supply voltage while the reset transistor is a NMOSFET connected to ground.

According to a second aspect of the present invention there is provided a pixel element for an image sensor comprising, a photodiode and a reset transistor connected to an input node, wherein said reset transistor is a NMOSFET connected between said input node and ground, and wherein said pixel further comprises parallel complementary signal paths.

Preferably the pixel element may comprise parallel complementary signal paths. In a preferred embodiment one said path includes an NMOS source follower, and the other said path includes a PMOS source follower, and the NMOS and PMOS source followers have a common gate connected to the input node. The outputs of the paths are combined to form a pixel output.

According to another aspect, the present invention provides a pixel element for an image sensor comprising, a photodiode and a reset transistor connected to an input node, and wherein the pixel element comprises parallel complementary signal paths, one path including an NMOS source follower and the other signal path including a PMOS source follower, with both the source followers having a common gate connected to the input node.

According to a still further aspect the present invention provides an optical sensor comprising at least one pixel wherein the pixel generates an output voltage that falls at a rate dependent on the light intensity incident on the pixel, and wherein means are provided for measuring the time for the pixel output voltage to drop from a first predefined level to a second predefined level so as to produce an output indicative of the incident light intensity.

According to still further aspect the present invention also provides a method of generating an output from a pixel of an optical sensor wherein the pixel generates an output voltage that falls at a rate dependent on the light intensity incident on the pixel, the method comprising measuring the time for the pixel output voltage to drop from a first predefined level to a second predefined level.

BRIEF DESCRIPTION OF THE DRAWINGS

Some embodiments of the invention will now be described by way of example and with reference to the accompanying drawings, in which.

DETAILED DESCRIPTION OF PREFERRED EMBODIMENTS

Figure 1:
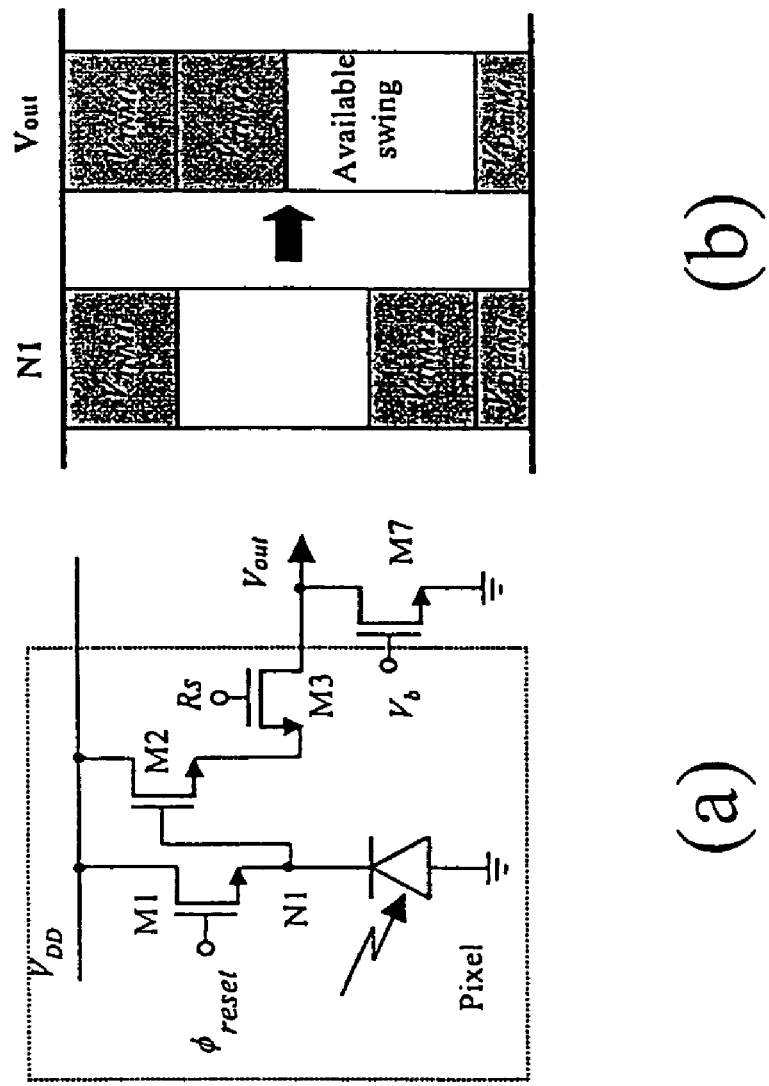
FIGS. 1(a) and (b) illustrate (a) a conventional APS architecture and (b) the available output voltage swing, FIGS. 2(a), (b) and (c) show (a) the architecture of a sensor according to an embodiment of the invention, (b) the available output voltage swing and (c) the same structure with the reset transistor changed to NMOSFET and the photodiode connected to the power supply, FIGS. 3(a) and (b) show outputs from an embodiment of the invention and, in FIG. 3(b) the output from the prior art by way of comparison, FIGS. 4(a), (b), (c) and (d) show cross-sectional views of four possible structures of the embodiments of the invention, (a) on bulk silicon with light coming from the top, (b) on SOI with light coming from the top, (c) on SOI with light coming from the bottom, and (d) on bulk silicon with light coming from the bottom after thinning the silicon substrate
Figure 2:
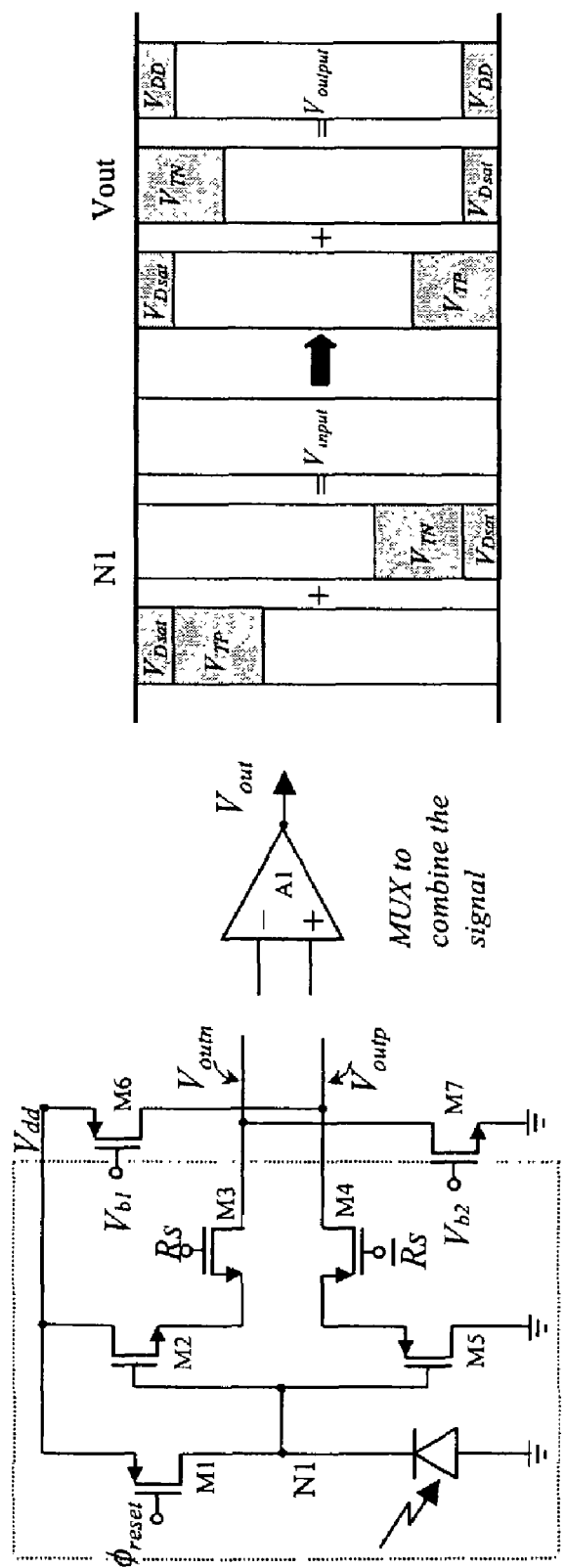

Referring firstly to FIG. 2(a) an embodiment of the invention will now be described in the form of an active pixel sensor. It will be understood that FIG. 2(a) shows just one pixel and in use an array of pixels may be provided. In comparison with the conventional APS architecture shown in FIG. 1(a) it will be noted that the NMOS reset transistor M1 of the prior art has been replaced by a PMOSFET reset transistor M1. This allows the input node to go all the way to $V_{DD}$ when the chip is reset. After reset, the photodiode will discharge N1 at a rate that is proportional to the incident light intensity. This signal is amplified by the source follower M2 and arrives at the node $V_{outn}$. As in the prior art M3 is a NMOS transmission gate that is provided to allow the signal to pass upon application of a row select signal. In this signal path there will be an inevitable drop $V_T$ due to the source follower M2, and to compensate for this a complementary signal path is provided comprising a PMOS common drain amplifier M5 and an associated PMOS transmission gate M4. This complementary signal path produces an output $V_{outp}$ and the two outputs ($V_{outn}$ and $V_{outp}$) are combined to give the pixel output $V_{out}$.

As mentioned above, a PMOS reset transistor is used to eliminate the threshold voltage drop between $V_{DD}$ and the node N1. In addition, two complementary source followers M2 and M5 are used to amplify the signal on node N1 and the two complementary paths are combined to give the pixel output.

The input and output swing of the NMOS source follower M2 is given by:

$$V_{dsat}+V_{TN}<V_{Ninput}<V_{DD}$$

$$V_{dsat}<V_{Noutput}<V_{DD}-V_{TN}$$

Where $V_{Ninput}$ and $V_{Noutput}$ are the input and output swings of the node N1 respectively. $V_{TN}$ is the threshold voltage of the N-type source follower M2 and $V_{dsat}$ is the voltage across the current source.

The input swing of the PMOS source follower M5 is given by:

$$0<V_{Pinput}<V_{DD}-V_{dsat}-V_{TP}$$

$$V_{TP}<V_{Poutput}<V_{DD}-V_{dsat}$$

In order to ensure a full rail-to-rail input, the supply voltage $V_{DD}$ has to be at least $V_{TN}+V_{TP}+2V_{dsat}$. At the same time, the available output swing is close to rail-to-rail:

$$V_{dsat}<V_{output}<V_{DD}-V_{dsat}$$

This maximum available output swing is shown schematically in FIG. 2(b) and it will be seen from a simple comparison of FIGS. 1(b) and 2(b) that the architecture of the present invention, at least in its preferred forms, provides for a much greater output swing. In particular this allows the minimum supply voltage to be reduced, for example to as low as 1.2 V in 0.25 μm CMOS technology where typically $V_{TN}$=0.4 V, $V_{TP}$=0.6 V and $V_{dsat}$=0.1 V. Furthermore if the bias transistors are operated in the triode or weak inversion mode, the supply voltage can be even lower.

FIG. 2(c) shows the complementary structure derived from the pixel architecture given in FIG. 2(b) with the photodiode connected to the power supply voltage and the reset transistor replaced by an NMOSFET connected to ground.

Figure 3:
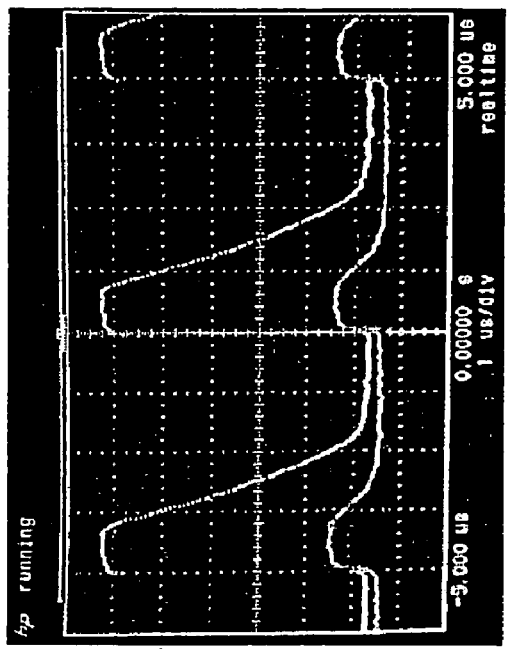
Figure 3:
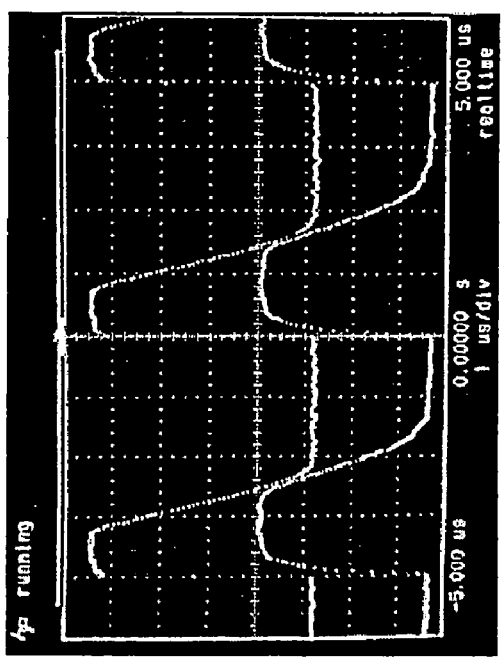

FIG. 3 illustrates experimental outputs from an embodiment of the invention using the TSMC [Taiwan Semiconductor Manufacturing Company] 0.25 μm CMOS process with 5 metal and 1 polysilicon layer. FIG. 3(a) shows the outputs of the two complementary signal paths at a 1 V supply voltage, while the output signal after their combination is shown in FIG. 3(b). FIG. 3(b) also shows a conventional trace from a prior art design (this is the lower trace in FIG. 3(b)). It can be seen from FIG. 3(b) that the design of the present invention is capable of working at a 1 V supply voltage, whereas the conventional prior art design is incapable of so doing.

It will also be understood that in the embodiment of FIG. 2(a) the reset transistor could be a NMOSFET transistor, in which case source follower M2 would be PMOS, and complementary source follower M5 would be NMOS.

Figure 4:
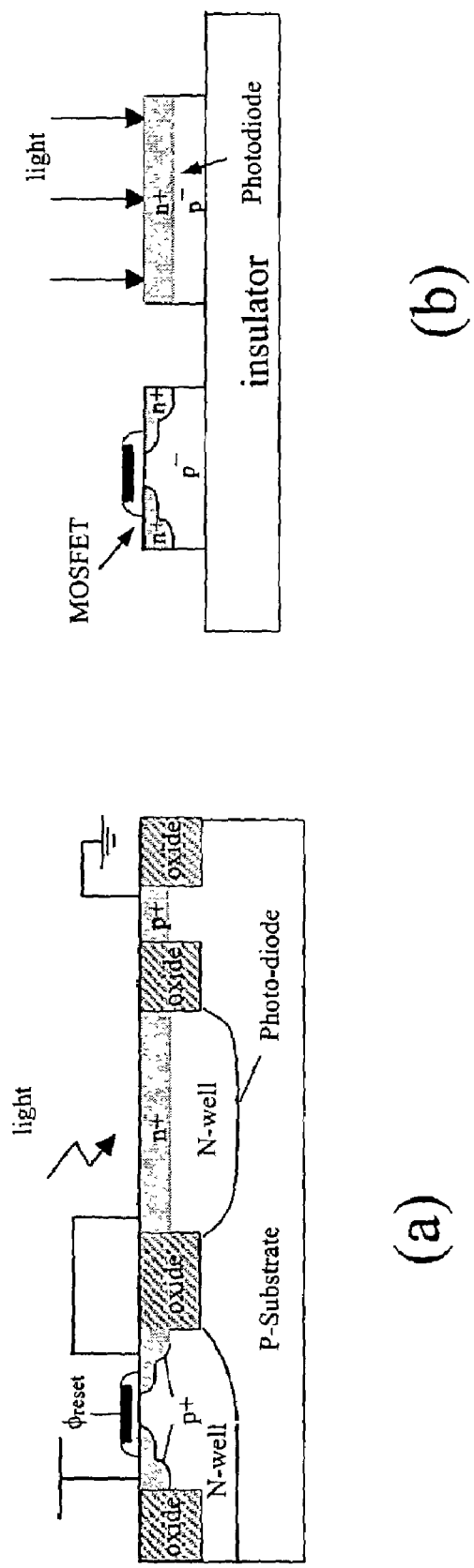

An active pixel sensor according to an embodiment of this invention could be implemented through bulk silicon technology, but could also be implemented using silicon-on-insulator (SOI) technology. FIG. 4(a) shows an example of a device manufactured using bulk silicon technology and FIG. 4(b) shows and example of a device manufactured using SOI technology. SOI technology uses a thin layer of silicon on an insulator and all active devices are fabricated in the thin layer. Compared to bulk technology SOI technology has a number of advantages including: better isolation between pixels leading to smaller interference between pixels; SOI CMOS technology does not require a separate well for the PMOSFET and can thus provide a higher fill-factor because the transistors in the pixel can be packed closer together; and SOI can further reduce the power consumption due to the smaller loading that has to be driven.

In FIG. 4(a) and FIG. 4(b), light is incident on the top of the sensor. However, light could also be incident from the bottom as shown in FIG. 4(c) in which the active pixel sensor is implemented on a transparent substrate such as sapphire. Alternatively, the back side of the device could be made transparent by forming it to be very thin by polishing as shown in FIG. 4(d).

Figure 5:
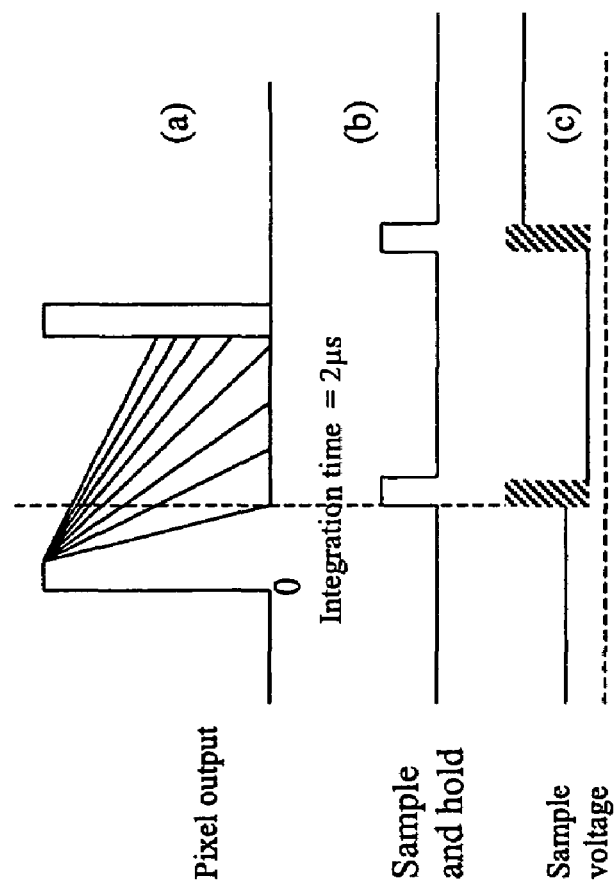
FIG. 5 illustrates a conventional readout methodology.

The voltage output of the active pixel sensor element will have a slope which depends on the illumination intensity with the slope increasing with increasing intensity. The slope, and thus the intensity, may be extracted from the output using known double sampling (DS) or correlated double sampling (CDS) techniques. FIG. 5 illustrates a conventional CDS technique in which the voltage difference is measured over a fixed time interval. A disadvantage with a conventional CDS technique, however, is that it requires an analog-to-digital converter (ADC) capable of a very fine degree of resolution, which is quite difficult to achieve in an ultra low voltage environment. For example, even with an APS according to an embodiment of the invention, at 1V operation the output swing is only 0.55 V and to achieve 8-bits resolution the ADC needs to have a resolution of 2 mV. This implies that the practical dynamic range of an APS is governed not only by the APS architecture itself, but also by the readout method.

Figure 6:
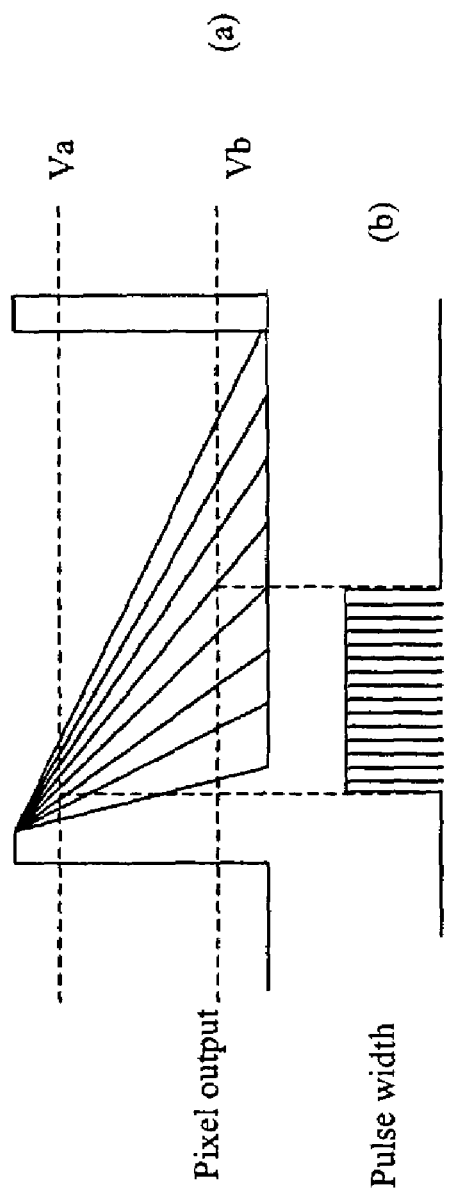
FIG. 6 illustrates a readout methodology according to an embodiment of the invention.
Figure 2:
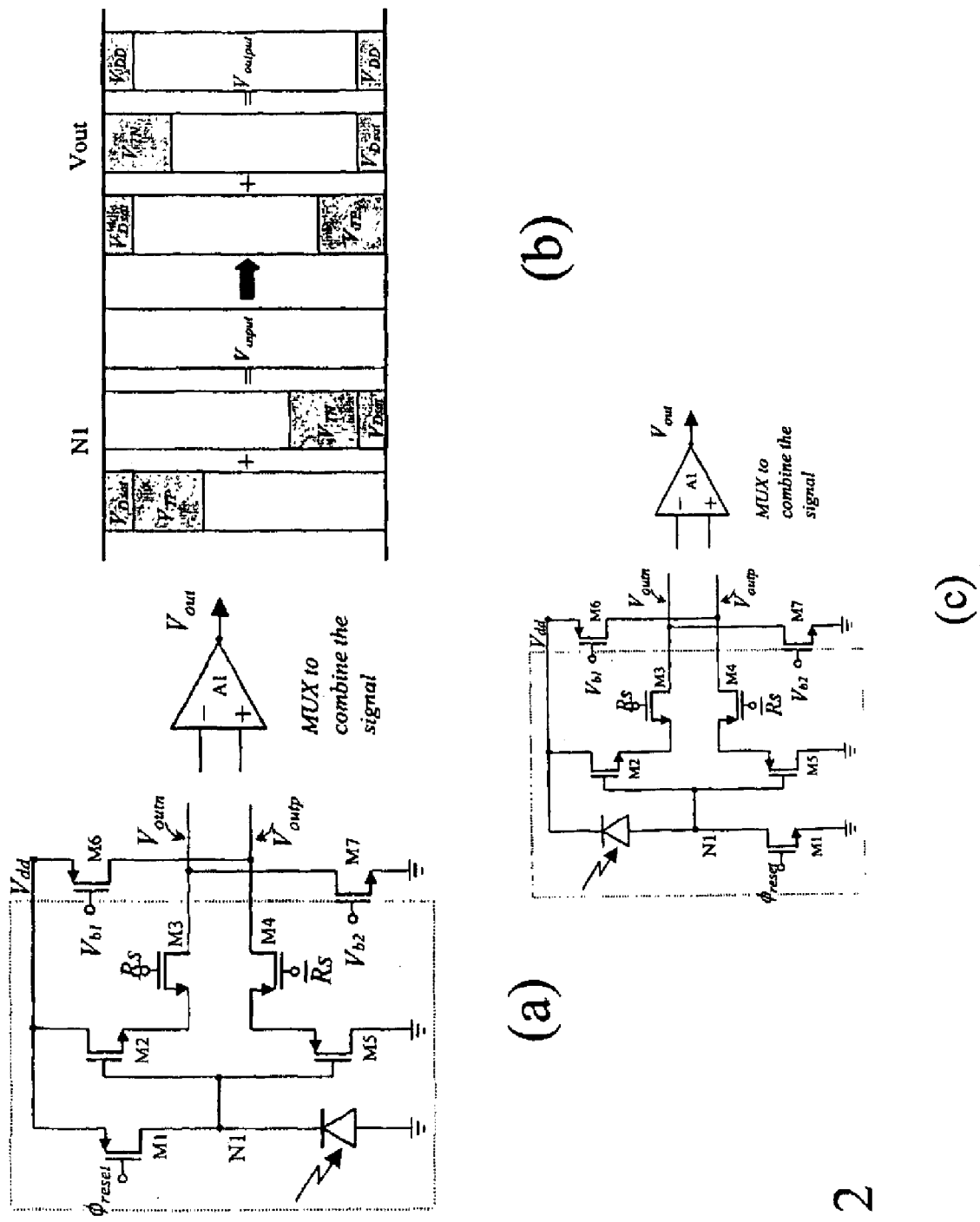

FIG. 6 illustrates a novel readout methodology that may preferably be used in place of a conventional CDS technique. In the method of FIG. 6 two fixed voltages $V_a$ and $V_b$ are defined and the time taken for the pixel output to drop from $V_a$ to $V_b$ is measured. This time is inversely proportional to the illumination intensity. In this method, the dynamic range depends on the conversion speed of the ADC rather than its available output swing and this is easier to control with precision, especially in an ultra low voltage environment.

What is claimed is:

1. A pixel element for an image sensor comprising a photodiode and a reset transistor connected to an input node, wherein said reset transistor is an NMOSFET connected between said input node and ground, and wherein said pixel further comprises parallel complementary signal paths whose outputs are physically combined to form a pixel output.

2. A pixel element for an image sensor comprising, a photodiode and a reset transistor connected to an input node, wherein said reset transistor is a PMOSFET connected between said input node and the supply voltage, and wherein said pixel further comprises parallel complementary signal paths, and wherein one of said paths includes an NMOS source follower, and the other of said paths includes a PMOS source follower, and wherein said NMOS and PMOS source followers have the gate voltage connected to said input node.

3. A pixel element as claimed in claim 2 wherein the outputs of said paths are combined to form a pixel output.

4. A pixel element as claimed in claim 2 wherein said pixel element is fabricated using silicon-on-insulator technology.

5. A pixel element as claimed in claim 4 wherein said reset transistor, said photodiode and all other active devices are fabricated on a thin silicon film on a substrate without the use of a separate well.

6. A pixel element as claimed in claim 4 wherein said reset transistor, said photodiode and all other active devices are formed on one side of a transparent insulating substrate, and wherein said photodiode is adapted to receive incident light that passes through said substrate from the other side of said substrate.

7. A pixel element as claimed in claim 6 wherein said transparent insulating substrate is obtained by thinning down the non-transparent silicon substrate.

8. A pixel element for an image sensor comprising, a photodiode and a reset transistor connected to an input node, and wherein said pixel element comprises parallel complementary signal paths, one said path including an NMOS source follower and the other said signal path including a PMOS source follower, and wherein said source followers have the gate voltage connected to the input node.

9. A pixel element as claimed in claim 1 wherein one of said paths includes an NMOS source follower, and the other of said paths includes a PMOS source follower, and wherein said NMOS and PMOS source followers have the gate voltage connected to said input node.

10. A pixel element as claimed in claim 1 wherein said pixel element is fabricated using silicon-on-insulator technology.

11. A pixel element as claimed in claim 10 wherein said reset transistor, said photodiode and all other active devices are fabricated on a thin silicon film on a substrate without the use of a separate well.

12. A pixel element as claimed in claim 10 wherein said reset transistor, said photodiode and all other active devices are formed on one side of a transparent insulating substrate, and wherein said photodiode is adapted to receive incident light that passes through said substrate from the other side of said substrate.

13. A pixel element as claimed in claim 12 wherein said transparent insulating substrate is obtained by thinning down the non-transparent silicon substrate.

14. A pixel element for an image sensor comprising, a photodiode and a reset transistor connected to an input node, wherein said reset transistor is an NMOSFET connected between said input node and the supply voltage, and wherein said pixel further comprises parallel complementary signal paths, and wherein one of said paths includes an NMOS source follower, and the other of said paths includes a PMOS source follower, and wherein said NMOS and PMOS source followers have the gate voltage connected to said input node.

15. A pixel element as claimed in claim 14 wherein the outputs of said paths are combined to form a pixel output.

16. A pixel element as claimed in claim 14 wherein said pixel element is fabricated using silicon-on-insulator technology.

17. A pixel element as claimed in claim 16 wherein said reset transistor, said photodiode and all other active devices are fabricated on a thin silicon film on a substrate without the use of a separate well.

18. A pixel element as claimed in claim 16 wherein said reset transistor, said photodiode and all other active devices are formed on one side of a transparent insulating substrate, and wherein said photodiode is adapted to receive incident light that passes through said substrate from the other side of said substrate.

19. A pixel element as claimed in claim 18 wherein said transparent insulating substrate is obtained by thinning down the non-transparent silicon substrate.

* * * * *

UNITED STATES PATENT AND TRADEMARK OFFICE
CERTIFICATE OF CORRECTION

| | |
|---|---|
| PATENT NO. | : 7,005,626 B2 |
| APPLICATION NO. | : 10/219260 |
| DATED | : February 28, 2006 |
| INVENTOR(S) | : Chan et al. |

It is certified that error appears in the above-identified patent and that said Letters Patent is hereby corrected as shown below:

<u>In the Drawings</u>

The drawing sheet 2 of 6 consisting of Fig(s) 2(a)(b) should be deleted and substitute therefore the attached drawing sheet 2 of 6 consisting of Fig(s) 2(a)(b)(c).

Signed and Sealed this

Thirtieth Day of June, 2009

JOHN DOLL
*Acting Director of the United States Patent and Trademark Office*